(12) United States Patent
Guo et al.

(10) Patent No.: US 10,003,043 B2
(45) Date of Patent: Jun. 19, 2018

(54) OLED DISPLAY PANEL AND PRODUCTION PROCESS THEREOF

(71) Applicants: BOE Technology Group Co., Ltd., Beijing (CN); Hefei BOE Optoelectronics Technology Co., Ltd., Anhui (CN)

(72) Inventors: Yuanhui Guo, Beijing (CN); Hui Wang, Beijing (CN); Chun Wang, Beijing (CN); Yisan Zhang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 17 days.

(21) Appl. No.: 14/419,166

(22) PCT Filed: Apr. 24, 2014

(86) PCT No.: PCT/CN2014/076135
§ 371 (c)(1),
(2) Date: Feb. 2, 2015

(87) PCT Pub. No.: WO2015/096323
PCT Pub. Date: Jul. 2, 2015

(65) Prior Publication Data
US 2015/0340645 A1    Nov. 26, 2015

(30) Foreign Application Priority Data
Dec. 26, 2013    (CN) .......................... 2013 1 0730899

(51) Int. Cl.
*H01L 29/08* (2006.01)
*H01L 51/52* (2006.01)
(Continued)

(52) U.S. Cl.
CPC ...... *H01L 51/5237* (2013.01); *H01L 51/0081* (2013.01); *H01L 51/5262* (2013.01);
(Continued)

(58) Field of Classification Search
CPC ............. H01L 27/3248; H01L 51/5206; H01L 51/5237; H01L 51/0081; H01L 51/5262;
(Continued)

(56) References Cited

U.S. PATENT DOCUMENTS

2005/0208330 A1* 9/2005 Raychaudhuri ..... H01L 51/5271
428/690
2005/0221121 A1* 10/2005 Ishihara .............. H01L 51/5036
428/690

(Continued)

FOREIGN PATENT DOCUMENTS

CN    101369630 A    2/2009
CN    102593369 A    7/2012
(Continued)

OTHER PUBLICATIONS

First Office Action, including Search Report, for Chinese Patent Application No. 201310730899.8, dated Jul. 16, 2015, 8 pages.
(Continued)

*Primary Examiner* — Stephen Bradley
*Assistant Examiner* — Patricia Reddington
(74) *Attorney, Agent, or Firm* — Westman, Champlin & Koehler, P.A.

(57) ABSTRACT

The invention provides an OLED display panel and the production process thereof, which relates to the technical field of display, may improve the surface flatness and the water-oxygen permeation resistance of the flexible base substrate, improve the light output ratio of the display panel, and may control the center wavelength of the electroluminescence spectrum. The display panel comprises an anode
(Continued)

and a cathode provided on a flexible base substrate, and an organic material functional layer situated between the anode and the cathode, and it further comprises a reticular light output coupling layer provided on the flexible base substrate and contacting the flexible base substrate; the anode, the cathode, the organic material functional layer are all provided on the reticular light output coupling layer; the reticular light output coupling layer, the anode and the cathode, and the organic material functional layer compose a micro-cavity; the micro-cavity is used for controlling the center wavelength of the electroluminescence spectrum and the light output ratio. The material of the reticular light output coupling layer is a reticular high molecular material having a high refractive index and a low absorptivity in the visible light range; and it is used for the production of the flexible OLED display panel.

9 Claims, 4 Drawing Sheets

(51) Int. Cl.
H01L 51/56 (2006.01)
H01L 51/00 (2006.01)
(52) U.S. Cl.
CPC .......... *H01L 51/56* (2013.01); *H01L 51/0097* (2013.01); *H01L 51/5265* (2013.01); *H01L 51/5275* (2013.01)
(58) Field of Classification Search
CPC . H01L 51/56; H01L 51/0097; H01L 51/5265; H01L 51/5275
USPC .......................................................... 257/40
See application file for complete search history.

(56) References Cited

U.S. PATENT DOCUMENTS

| 2007/0257608 | A1 | 11/2007 | Tyan et al. |
| 2009/0072751 | A1 | 3/2009 | Tischler |
| 2009/0134790 | A1* | 5/2009 | Kwok ................. H01L 27/3248 313/504 |
| 2010/0148666 | A1* | 6/2010 | Liu ........................... C08F 2/46 313/512 |
| 2012/0267616 | A1* | 10/2012 | Jang ....................... B82Y 20/00 257/40 |
| 2014/0042426 | A1* | 2/2014 | Nishimura .......... H01L 51/5275 257/40 |
| 2016/0254492 | A1* | 9/2016 | Wu ..................... H01L 51/5262 257/40 |

FOREIGN PATENT DOCUMENTS

| CN | 102623647 A | 8/2012 |
| CN | 102769104 A | 11/2012 |
| CN | 103187535 A | 7/2013 |
| CN | 103700782 A | 4/2014 |
| WO | 2010012279 A1 | 2/2010 |

OTHER PUBLICATIONS

English translation of Box No. V from the Written Opinion for the International Searching Authority for PCT Application No. PCT/CN2014/076135, 2 pages.
International Search Report and Written Opinion (in Chinese only) for PCT Application No. PCT/CN2014/076135, dated Aug. 8, 2014, 10 pages.
The Extended European Search Report, for European Patent Application No. 14861125.4 dated Jun. 16, 2016, 6 pages.

* cited by examiner

OLED DISPLAY PANEL AND PRODUCTION PROCESS THEREOF

CROSS-REFERENCE TO RELATED APPLICATION

This Application is a Section 371 National Stage Application of International Application No. PCT/CN2014/076135, filed 24 Apr. 2014, which has not yet published, and claims priority to Chinese Patent Application No. 201310730899.8, filed on Dec. 26, 2013, in Chinese, the contents of which are hereby incorporated by reference in their entirety.

FIELD OF THE INVENTION

The invention relates to the technical field of display, especially relates to an OLED display panel and the production process thereof.

BACKGROUND OF THE INVENTION

Comparing with a liquid crystal display (Liquid Crystal Display, referred to as LCD), an organic electroluminescence diode device (Organic Light-Emitting Diode, referred to as OLED) has the advantages such as thin, light, broad angle of view, initiative luminescence, continuously adjustable emitting color, low cost, fast response speed, low energy cost, low driving voltage, high emitting efficiency, broad working temperature range, simple production process, and flexible display or the like, which is greatly attended by the industry and the science world.

The basic structure of OLED comprises an anode 20 and a cathode 30 provided on a base substrate 10, and an organic material functional layer 40 provided between the anode 20 and the cathode 30. In order to improve the light output ratio of OLED and reduce the emission loss on the surface of the anode 20, as shown by FIGS. 1(a) and 1(b), a transmission enhanced film 50 may be provided between the anode 20 and the base substrate 10 or provided outside the base substrate 10, to reduce the reflected light using the interference of the thin film, so as to improve the light output ratio.

In addition, when the base substrate 10 is a flexible base substrate 10, because the surface roughness of the flexible base substrate 10 is generally larger than the surface roughness of the glass base substrate, in the case of bending, the breaking or the peeling off of the film layer provided on the flexible base substrate 10 is very easily caused due to the uneven and the stress effect of the surface of the flexible base substrate 10. In order to solve the flatness problem between the flexible base substrate 10 and the film layer, a buffer layer 60 is generally provided between the flexible base substrate 10 and the film layer. The buffer layer 60 has a stronger adhesion to the flexible base substrate 10 and the film layer. Such a buffer layer 60 comprises various types, wherein the most important ones are materials having a photo-crosslinkable group, such as a photoresist. The high molecular structure formed by this material through ultraviolet curing is not only helpful for improving the surface flatness and the adhesion of the flexible base substrate 10, but also helpful for improving the water-oxygen permeation resistance.

In the prior art, an OLED display panel using a flexible base substrate 10 should be provided with a two layered structure of a transmission enhanced film 50 and a buffer layer 60 at the same time to achieve the function of improving the surface flatness of the flexible base substrate 10 and to improve the light output ratio. However, it may result in the complication of the production process for the OLED panel.

SUMMARY OF THE INVENTION

The invention provides an OLED display panel and the production process thereof, which may improve the surface flatness and the water-oxygen permeation resistance of the flexible base substrate, and improve the light output ratio of the display panel.

In order to achieve the above object, the invention employs the following technical solutions.

In one aspect, the invention provides an OLED display panel, comprising an anode and a cathode provided on a flexible base substrate, and an organic material functional layer provided between the anode and the cathode; the display panel further comprises a reticular light output coupling layer provided on the flexible base substrate and contacting the flexible base substrate; wherein the anode, the cathode and the organic material functional layer are all provided on the reticular light output coupling layer; the reticular light output coupling layer, the anode and the cathode, and the organic material functional layer compose a micro-cavity; the micro-cavity is used for controlling the center wavelength of the electroluminescence spectrum and the light output ratio; the material of the reticular light output coupling layer is a reticular high molecular material having a high refractive index and a low absorptivity in the visible light range.

Preferably, the material of the reticular light output coupling layer comprises a high molecular tris(8-hydroxyquinolinato)aluminium derivative.

More preferably, the thickness of the reticular light output coupling layer is between 0 and 100 nm.

Alternatively, the anode is a transparent electrode or a metal electrode; the cathode is a metal electrode; wherein the anode is provided close to the reticular light output coupling layer, and in the case where the anode is a metal electrode, the thickness of the anode is between 20 and 40 nm.

Alternatively, the display panel further comprises a thin film transistor provided on the flexible base substrate; wherein the drain electrode of the thin film transistor is electrically connected to the anode.

Alternatively, the display panel further comprises a flexible encapsulating substrate or an encapsulating thin film.

In another aspect, the invention provides a production process of an OLED display panel, comprising: forming a reticular light output coupling layer on a flexible base substrate; on the substrate on which the reticular light output coupling layer is formed, forming an anode and a cathode, and an organic material functional layer between the anode and the cathode; wherein the reticular light output coupling layer, the anode and the cathode, and the organic material functional layer compose a micro-cavity; the micro-cavity is used for controlling the center wavelength of the electroluminescence spectrum and the light output ratio; the material of the reticular light output coupling layer is a reticular high molecular material having a high refractive index and a low absorptivity in the visible light range.

In an embodiment of the invention, the refractive index of the material of the reticular light output coupling layer is larger than 1.5.

In an embodiment of the invention, the absorptivity of the material of the reticular light output coupling layer in the visible light range is less than 0.1.

In an embodiment of the invention, the material of the reticular light output coupling layer is a reticular high molecular material formed by the photo-crosslinking reaction of a small molecular material having a photo-crosslinkable group through ultraviolet curing.

In an embodiment of the invention, the material of the reticular light output coupling layer comprises a high molecular tris(8-hydroxyquinolinato)aluminium derivative formed by the photo-crosslinking reaction of a small molecular tris(8-hydroxyquinolinato)aluminium derivative having a photo-crosslinkable group.

Preferably, the material of the reticular light output coupling layer comprises a high molecular tris(8-hydroxyquinolinato)aluminium derivative.

More preferably, the thickness of the reticular light output coupling layer is between 0 and 100 nm.

Alternatively, the process further comprises forming a thin film transistor on the flexible base substrate; wherein the drain electrode of the thin film transistor is electrically connected to the anode.

Alternatively, the process further comprises forming a flexible encapsulating substrate or an encapsulating thin film.

The invention provides an OLED display panel and the production process thereof, wherein the OLED display panel comprises an anode and a cathode provided on a flexible base substrate, and an organic material functional layer provided between the anode and the cathode; the display panel further comprises a reticular light output coupling layer provided on the flexible base substrate and connecting the flexible base substrate; wherein the anode, the cathode, and the organic material functional layer are all provided on the reticular light output coupling layer; the reticular light output coupling layer, the anode and the cathode, and the organic material functional layer compose a micro-cavity; the micro-cavity is used for controlling the center wavelength of the electroluminescence spectrum and the light output ratio; the material of the reticular light output coupling layer is a reticular high molecular material having a high refractive index and a low absorptivity within the visible light range.

Because the material forming the reticular light output coupling layer has a reticular molecular structure, the reticular light output coupling layer is not only helpful for improving the surface flatness of the flexible base substrate so as to improve the adhesion between the film layer provided on the flexible base substrate and the flexible base substrate, and may also improve the water-oxygen permeation resistance of the display panel. In addition, the material of the reticular light output coupling layer has the features such as a high refractive index, a small absorptivity in the visible light range, and the like, which may be used as a transmission enhanced film, and helpful for reducing the emission loss on the anode surface of the display panel, so as to improve the light output ratio of OLED. Furthermore, the spectrum narrowing and the wavelength shifting may be controlled by controlling the cavity length of the micro-cavity composed of the reticular light output coupling layer, the anode and the cathode, and the organic material functional layer, so as to control the center wavelength of the electroluminescence spectrum and to improve the light output ratio.

BRIEF DESCRIPTION OF THE DRAWINGS

In order to more clearly describe the technical solutions of the invention or the prior art, figures required to be used in the description of examples or prior art will be briefly introduced below. Obviously, figures in the following description are only some examples of the invention. As for a person skilled in the art, without paying inventive labours, other figures may be also obtained according to these figures.

REFERENCE SIGN OF FIGURES

10—(flexible) base substrate; 20—anode; 30—cathode; 40—organic material functional layer; 50—transmission enhanced film; 60—buffer layer; 70—light output coupling layer; 80—thin film transistor.

DETAILED DESCRIPTION OF THE INVENTION

The technical solution in the invention will be clearly and completely described below, in combination with figures in the invention. Obviously, the described examples are only a part of the examples in the invention, instead of all examples. On the basis of the examples in the invention, all other examples obtained by the person skilled in the art without paying inventive labours belong to the protection scope of the invention.

Figure 1:
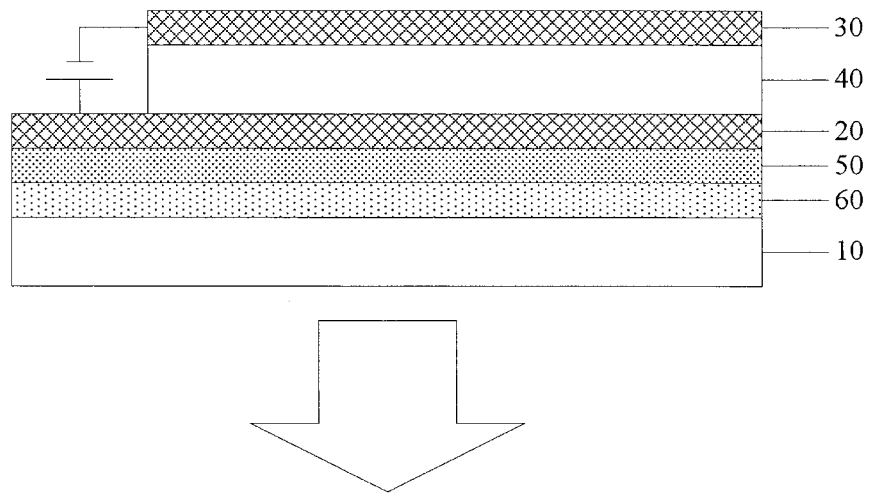
FIGS. 1(a) and 1(b) are the structural schematic diagrams of an OLED display panel in the prior art.
Figure 1:
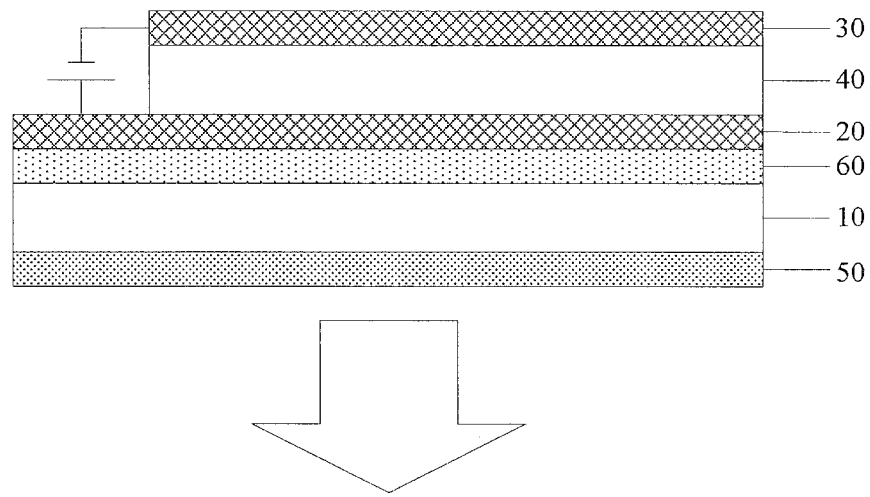
Figure 2:
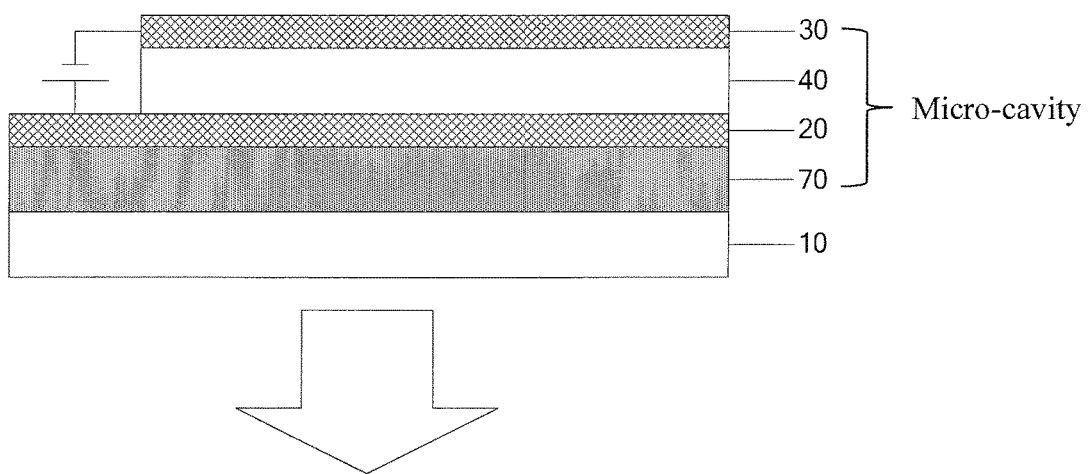
FIG. 2 is a structural schematic diagram of an OLED display panel provided by the invention.

The invention provides an OLED display panel, as shown by FIG. 2, comprising an anode 20 and a cathode 30 provided on a flexible base substrate 10, and an organic material functional layer 40 provided between the anode 20 and the cathode 30; the display panel further comprises a reticular light output coupling layer 70 provided on the flexible base substrate 10 and contacting the flexible base substrate 10; wherein the anode 20, the cathode 30, and the organic material functional layer 40 are all provided on the reticular light output coupling layer 70; the reticular light output coupling layer 70, the anode 20 and the cathode 30, and the organic material functional layer 40 compose a micro-cavity; the micro-cavity is used for controlling the center wavelength of the electroluminescence spectrum and the light output ratio; the material of the reticular light output coupling layer 70 is a reticular high molecular material having a high refractive index and a low absorptivity in the visible light range.

Wherein, the organic material functional layer 40 is used for the emitting of the display panel. On the basis of the above, the organic material functional layer 40 may at least comprise an electron transport layer and a hole transport layer, and a light emitting layer between them. In order to improve the efficiency of the electron and hole injecting light emitting layer, the organic material functional layer 40 may further comprise an electron injection layer provided between the cathode 30 and the electron transport layer, and a hole injection layer provided between the anode 20 and the hole transport layer.

When applying a working voltage to the anode 20 and the cathode 30 of the display panel, the holes in the anode 20 and the electrons in the cathode 30 are both injected into the light emitting layer. The holes and the electrons encounter in the light emitting layer, and they recombine together to form electron-hole pairs due to the action of Coulomb force, and release energy. The energy is emitted in form of light, which passes through different light emitting molecules in the light emitting layer so as to display light with different color, and uniformly emits from two sides of the organic material functional layer 40.

On the basis of the above, the light emitting layer may at least comprise light emitting molecules emitting red light, green light, and blue light; of course, it may further comprise light emitting molecules emitting white light.

Based on the above description it can be known that, the light emitted from the organic material functional layer 40 is bidirectional light, that is, the light is emitted from both the upside and the downside of the organic material functional layer 40. Therefore, during the process of the light transmission, if it is not blocked, the light may be directly emitted from the display panel, if it is blocked by for example an electrode made of an opaque material, the light will be reflected back by the electrode made of the opaque material, so as to emit from the other direction of the display panel.

Therefore, according to the difference between the material of the anode 20 and the cathode 30, the display panel may be divided into a single face emitting display panel and a double face emitting display panel. That is, when the material of one electrode of the anode 20 and the cathode 30 is an opaque material, the display panel is a single face emitting display panel, and when the materials of the anode 20 and the cathode 30 are all transparent materials, the display panel is a double face emitting display panel.

It should be noticed that, firstly, the reticular light output coupling layer 70 means that the material forming the light output coupling layer is a material having a reticular molecular structure, and such a material may be formed by the photo-crosslinking reaction of a small molecular material having photo-crosslinkable group through ultraviolet curing. The reticular light output coupling layer 70 formed with such material is not only helpful for improving the surface flatness of the flexible base substrate 10 so as to improve the adhesion between the film layer and the flexible base substrate 10, but also helpful for improving the water-oxygen permeation resistance of the display panel.

Furthermore, when this type of material has the features such as a high refractive index, less absorption in the visible light range, and the like, the reticular light output coupling layer 70 formed from such material may be used as a transmission enhanced film. On the basis of the above, the reticular light output coupling layer 70 may also have the function of reducing the emission loss on the anode surface of the display panel so as to be able to improve the light output ratio of OLED.

Secondly, the relative positions and the materials of the anode 20 and the cathode 30 are not limited, but in the examples of the invention, because one of the function of the reticular light output coupling layer 70 provided is to improve the light output ratio, therefore, the invention at least has a light output side on the side of the organic material functional layer 40 close to the reticular light output coupling layer 70. On the basis of the above, the electrode close to the reticular light output coupling layer 70 employs a transparent material.

Furthermore, the invention may have the light output side only on the side of the organic material functional layer 40 close to the reticular light output coupling layer 70, and in this case, the electrode on the side of the organic material functional layer 40 away from the reticular light output coupling layer 70 employs an opaque material; or the side of the organic material functional layer 40 away from the reticular light output coupling layer 70 may also be a light output side, and in this case, the electrode on the side of the organic material functional layer 40 away from the reticular light output coupling layer 70 also employs a transparent material.

Thirdly, the reticular light output coupling layer 70, the anode 20 and the cathode 30, and the organic material functional layer 40 compose a micro-cavity. In which, the micro-cavity is an optical micro-cavity, and the optical micro-cavity means an optical micro resonant cavity wherein the size of the cavity in at least one direction is enough small to be comparative with the resonant light wave.

Herein, in the direction vertical to the display panel, the thickness of the micro-cavity composed of the reticular light output coupling layer 70, the anode 20 and the cathode 30, and the organic material functional layer 40 is the cavity length of the micro-cavity, and the dimension of the cavity length of the micro-cavity is comparable with the resonant light wave.

Furthermore, the change of the thickness of the reticular light output coupling layer 70 may cause the change of the cavity length of the micro-cavity, so as to change the total optical thickness and the center wavelength of the emitting spectrum. Herein, the total optical thickness and the wavelength peak value of the micro-cavity emitting spectrum satisfy the following relationship:

$$L = \frac{Q_{ij}\lambda_m}{4\pi} + \sum_i n_i d_i = m\frac{\lambda_m}{2}$$

wherein, L is the total cavity length or the total light path of the micro-cavity; $Q_{ij}$ is the sum of the phase shifts of a light on the reflecting faces of the reticular light output coupling layer 70 and the cathode 30, respectively; $n_i$ and $d_i$ are the refractive index and the thickness of the organic material functional layer 40, respectively; m is the order of the emitting film; $\lambda_m$ is the wavelength of the film with an order of m.

According to the above description it can be known that, the total cavity length L of the micro-cavity may be adjusted by changing the thickness of the reticular light output coupling layer 70, while the total cavity length L of the micro-cavity corresponds to the emitting mode m and the peak value of the micro-cavity device in turn. Therefore, the total light path L of the micro-cavity may be adjusted by changing the thickness of the reticular light output coupling layer 70, so as to change the position of the emitting mode m and the emitting wavelength of the micro-cavity device, such that the center wavelength of the electroluminescence spectrum shifts.

It should be emphasized that, the above described center wavelength shifting phenomenon of the emitting spectrum caused by the micro-cavity effect is not the simple filtering effect to the light wave by the micro-cavity, it shows the enhancement effect with respect to some wavelengths and the suppression effect with respect to other wavelengths by the micro-cavity.

The invention provides an OLED display panel, comprising an anode 20 and a cathode 30 provided on the flexible base substrate 10, and an organic material functional layer 40 provided between the anode 20 and the cathode 30; the display panel further comprises a reticular light output coupling layer 70 provided on the flexible base substrate 10 and contacting the flexible base substrate 10; wherein, the anode 20, the cathode 30, and the organic material functional layer 40 are all provided on the reticular light output coupling layer 70; the reticular light output coupling layer 70, the anode 20 and the cathode 30, and the organic material functional layer 40 compose a micro-cavity; the micro-cavity is used for controlling the center wavelength of the electroluminescence spectrum and the light output ratio; the material of the reticular light output coupling layer 70 is a reticular high molecular material having a high refractive index and a low absorptivity in the visible light range.

Because the material forming the reticular light output coupling layer 70 has a reticular molecular structure, the reticular light output coupling layer 70 is not only helpful for improving the surface flatness of the flexible base substrate 10 so as to improve the adhesion between the film layer provided on the flexible base substrate and the flexible base substrate 10, but also may improve the water-oxygen permeation resistance of the display panel. In addition, the material of the reticular light output coupling layer 70 has the features such as a high refractive index, less adsorption in the visible light range, and the like, which may be used as a transmission enhanced film, and be helpful for reducing the emitting loss on the anode surface of the display panel, so as to improve the light output ratio of OLED. Furthermore, the spectrum narrowing and the wavelength shifting may be controlled by controlling the cavity length of the micro-cavity composed of the reticular light output coupling layer 70, the anode 20 and the cathode 30, and the organic material functional layer 40, so as to control the center wavelength of the electroluminescence spectrum and to improve light output ratio.

Preferably, the material of the reticular light output coupling layer 70 comprises a high molecular tris(8-hydroxyquinolinato)aluminium derivative.

Figure 3:
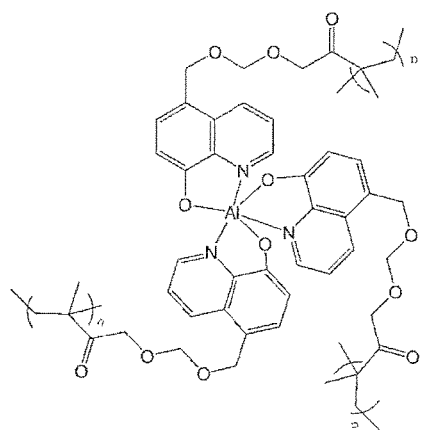
FIG. 3 is a molecular structural schematic diagram of the material of the reticular light output coupling layer (a high molecular tris(8-hydroxyquinolinato) aluminium derivative) provided by the invention.

In which, the molecular structure of the high molecular tris(8-hydroxyquinolinato)aluminium derivative is as shown by FIG. 3, such a high molecular tris(8-hydroxyquinolinato) aluminium derivative is a high molecular material having a reticular molecular structure.

Figure 4:
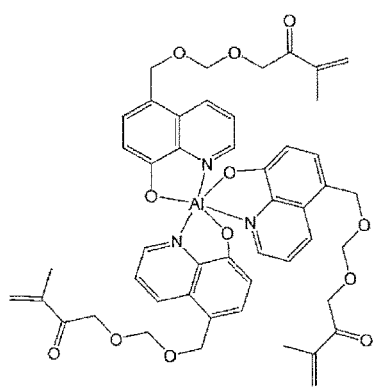
FIG. 4 is a molecular structure schematic diagram of the material (a small molecular tris(8-hydroxyquinolinato)aluminium derivative) used for the reaction forming the reticular light output coupling layer provided by the invention.

Herein, the high molecular tris(8-hydroxyquinolinato) aluminium derivative may be formed from the photo-crosslinking reaction of the tris(8-hydroxyquinolinato)aluminium derivative having a small molecular structure as shown by FIG. 4 through ultraviolet curing; wherein the molecular structure of tris(8-hydroxyquinolinato)aluminium derivative having a small molecular structure comprises a photo-crosslinkable group which may perform photo-crosslinking reaction.

Because the tris(8-hydroxyquinolinato)aluminium derivative having a small molecular structure has the features such as a high refractive index, less adsorption in the visible light range, and the like, it may satisfy the performance requirements of the transmission enhanced film, and it can be easily processed, and it is nontoxic. Therefore, this type of material is widely applied to the transmission enhanced film. When the above tris(8-hydroxyquinolinato)aluminium derivative having a small molecular structure is subjected to a photo-crosslinking reaction to form the high molecular tris(8-hydroxyquinolinato)aluminium derivative, because only the material having small molecular structure is transformed into a material having high molecule structure by the photo-crosslinking reaction, without essentially changing the structure thereof, the formed material having a high molecular structure still maintains the initial features. That is, the tris(8-hydroxyquinolinato)aluminium derivative having a high molecular structure has the same properties as those of the tris(8-hydroxyquinolinato)aluminium derivative having a smaller molecular structure, which may also be used as the transmission enhanced film, so as to improve the light output ratio of the display panel.

In addition, the high molecular tris(8-hydroxyquinolinato)aluminium derivative formed with the tris(8-hydroxyquinolinato)aluminium derivative having a small molecular structure has a reticular molecular structure, which is not only helpful for improving the surface flatness of the flexible base substrate 10 so as to improve the adhesion between the film layer and the flexible base substrate 10, but also helpful for improving the water-oxygen permeation resistance of the display panel.

The tris(8-hydroxyquinolinato)aluminium derivative in the invention may be produced according to the following process, for example, it may be produced by firstly synthesizing monomers of a derivative containing 8-hydroxyquinoline, and then complexing it with aluminum. In which, the monomer of the derivative containing 8-hydroxyquinoline may be synthesized by the reaction of a required modified 8-hydroxyquinoline, a catalyst, and a polymerization inhibitor in a proper solvent.

Furthermore, as for the OLED display panel, the optimal thickness of the reticular light output coupling layer 70 should be determined considering the properties and the thicknesses of the anode 20, the cathode 30, and the organic material functional layer 40. On the basis of the above, preferably, the thickness of the reticular light output coupling layer 70 is between 0 and 100 nm.

Wherein, the thickness of the reticular light output coupling layer 70 may be designed according to Fresnel coefficient matrix transformation theory to suppress the micro-cavity effect (multi-beam interference effect) so as to achieve a low reflectivity and a high light transmittance in a maximum degree.

On the basis of the above description, the OLED display panel provided by the invention is preferably a single face emitting display panel, that is, only the side on the organic material functional layer 40 close to the reticular light output coupling layer 70 is the light output side, and in this case, the anode 20 may be a transparent electrode or a metal electrode; the cathode 30 may be a metal electrode.

In which, the anode 20 is provided closed to the reticular light output coupling layer 70, and the cathode 30 is provided away from the reticular light output coupling layer 70.

Herein, when the anode 20 is a metal electrode, it is necessary to ensure the thickness of the metal electrode is very small, such that the metal electrode may be transparent. On the basis of the above, in the case that the anode 20 is a metal electrode, the thickness of the anode 20 is between 20 and 40 nm; or the anode 20 may employ a transparent electrode, for example an ITO (Indium Tin Oxides) electrode.

It should be noticed that, the anode 20 and the cathode 30 may be a monolayer structure or a multilayer structure, which are not limited herein.

Figure 5:
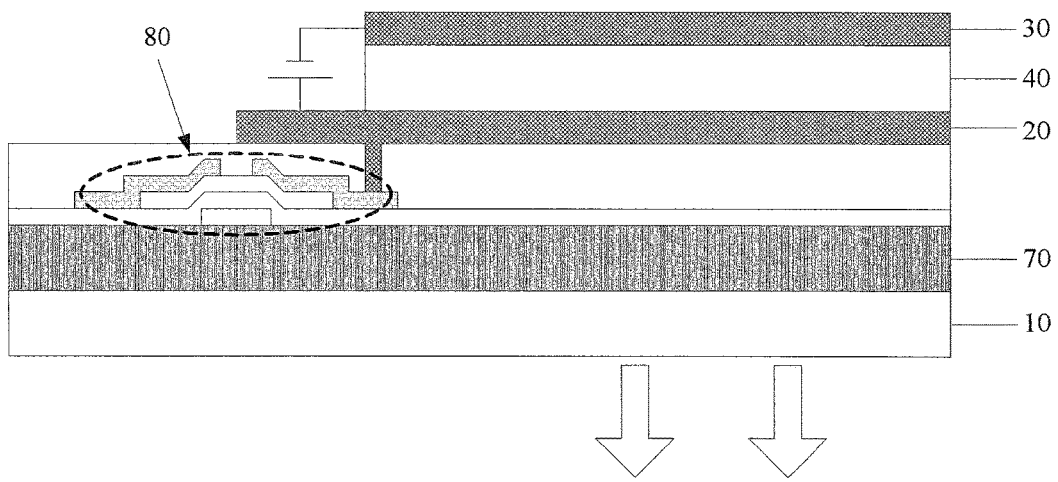
FIG. 5 is a structural schematic diagram of an active matrix OLED display panel provided by the invention.
Figure 6:
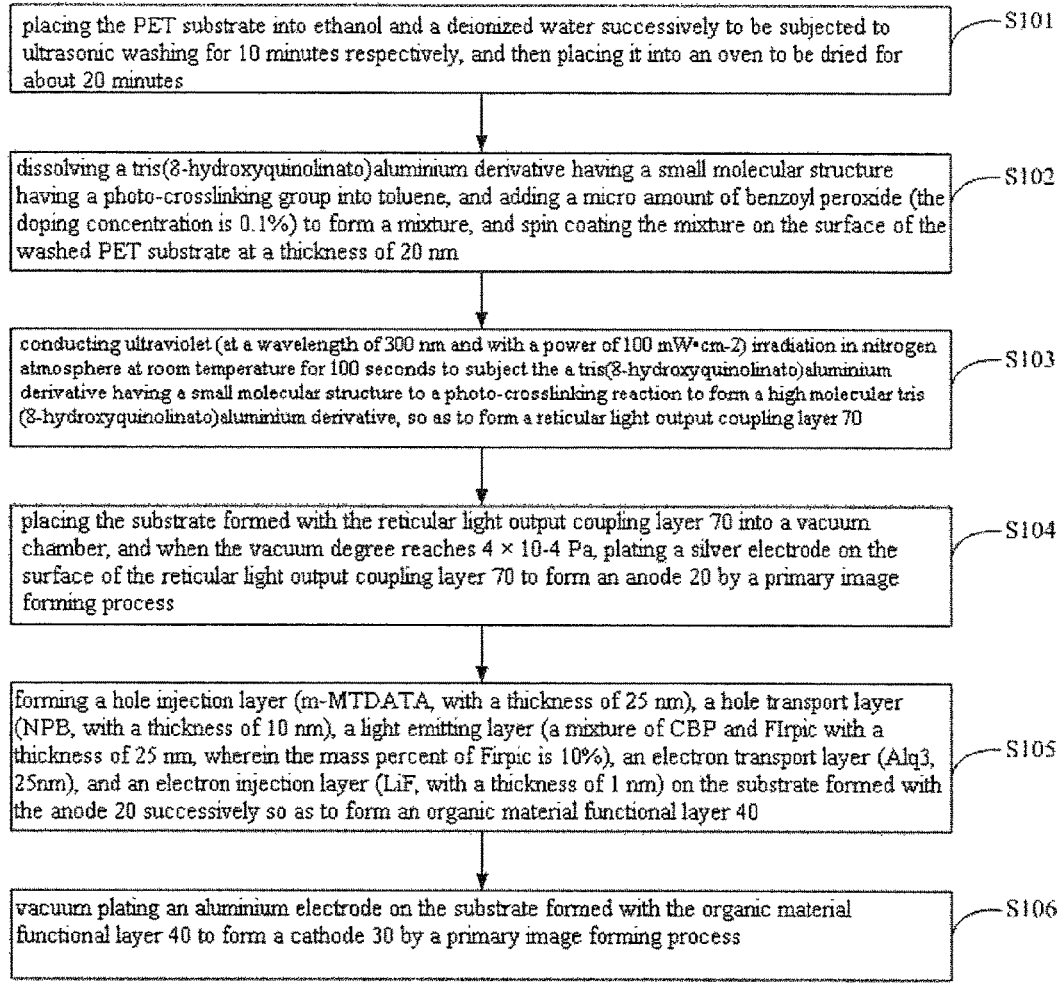
FIG. 6 is a flow diagram for preparing an OLED display panel provided by the invention.

As for the active matrix OLED, as shown by FIG. 5, the display panel may also comprise a thin film transistor 80 provided on the flexible base substrate 10; wherein, the drain electrode of the thin film transistor 80 is electrically connected to the anode 20.

Because the organic material in the above organic material functional layer 40 and the metal material as the electrode are very sensitive to oxygen and steam, oxygen and steam penetrating inside the display panel may influence the lifetime of the display panel, and therefore, all display panels may comprise an encapsulating substrate provided opposite to the flexible base substrate 10 for blocking oxygen and steam; wherein, the encapsulating substrate may be a flexible encapsulating substrate or an encapsulating thin film.

The invention further provides a production process of an OLED display panel, comprising: forming a reticular light output coupling layer 70 on the flexible base substrate 10; on the substrate formed with the reticular light output coupling layer 70, forming an anode 20 and a cathode 30, and an organic material functional layer 40 between the anode 20 and the cathode 30; wherein, the reticular light output coupling layer 70, the anode 20 and the cathode 30, and the organic material functional layer 40 compose a micro-cavity; the micro-cavity is used for controlling the center wavelength of the electroluminescence spectrum and light output ratio; the material of the reticular light output coupling layer 70 is a reticular high molecular material having a high refractive index and a low absorptivity in the visible light range.

Herein, the flexible base substrate 10 may comprise at least one of polyethylene (referred to as PE), polypropylene (referred to as PP), polystyrene (referred to as PS), polyethylene terephthalate (referred to as PET), polyethylene naphthalate (referred to as PEN), and polyimide (referred to as PI).

Because the reticular light output coupling layer 70 has the function of improving the surface flatness of the flexible base substrate 10, therefore, the reticular light output coupling layer 70 is required to be directly contacted with the flexible base substrate 10, and the anode 20, the cathode 30, and the organic material functional layer 40 are positioned above the reticular light output coupling layer 70.

In addition, the relative positions of the anode 20 and the cathode 30 may be exchanged with each other, and the organic material functional layer 40 is between them.

Preferably, the material of the reticular light output coupling layer 70 comprises a high molecular tris(8-hydroxyquinolinato)aluminium derivative; the molecular structure of the high molecular tris(8-hydroxyquinolinato)aluminium derivative is as shown by FIG. 3.

In which, when the high molecular tris(8-hydroxyquinolinato)aluminium derivative is formed, the washed surface of the flexible base substrate 10 may be spin coated with a mixture of a tris(8-hydroxyquinolinato)aluminium derivative with a small molecular structure having a photo-crosslinkable group as shown by FIG. 4 and a micro amount of a photoinitiator for example benzoyl peroxide (at a doping concentration of 0.1%), and irradiating the mixture spin-coated on the surface of the flexible base substrate 10 with ultraviolet light, so as to subject the mixture to the photo-crosslinking reaction under the irradiation of ultraviolet light, to form the high molecular tris(8-hydroxyquinolinato) aluminium derivative. Herein, the tris(8-hydroxyquinolinato)aluminium derivative manufactured by Jilin OLED Optical & Electronic Materials Co., Ltd. may be employed.

On the basis of the above, more preferably, the thickness of the reticular light output coupling layer 70 is between 0 and 100 nm.

In the case that the OLED display panel is a single face emitting type display panel, the side of the organic material functional layer 40 close to the reticular light output coupling layer 70 is the light output side; at this time, the anode 20 may be a transparent electrode or a metal electrode, the cathode 30 may be a metal electrode; wherein the anode 20 is provided closed to the reticular light output coupling layer 70, the cathode 30 is provided away from the reticular light output coupling layer 70.

When the anode 20 is a metal electrode, in order to ensure that the anode 20 is transparent, preferably, the thickness of the anode is between 20 and 40 nm; or the anode 20 may employ a transparent electrode for example an ITO electrode.

It should be noticed that, both of the anode 20 and the cathode 30 may be a monolayer structure or a multilayer structure, which is not limited herein.

As for the active matrix OLED, as shown by FIG. 5, preferably, the process further comprises forming a thin film transistor 80 on the flexible base substrate 10; wherein, the drain electrode of the thin film transistor 80 is electrically connected to the anode 20.

In addition, because the organic material in the organic material functional layer 40 and the metal material as the electrode are very sensitive to oxygen gas and stream, the process further comprises forming an encapsulating substrate opposite to the flexible base substrate 10; wherein the encapsulating substrate comprises a flexible encapsulating substrate or an encapsulating thin film.

A specific example is provided below to explain the specific production process of the display panel.

The display panel comprises a reticular light output coupling layer 70, an anode 20 and a cathode 30, and an organic material functional layer 40 between the anode 20 and the cathode 30 sequentially provided on the flexible base substrate 10.

In which, the flexible base substrate 10 employs a PET substrate; the material of the reticular light output coupling layer 70 is a high molecular tris(8-hydroxyquinolinato) aluminium derivative with a thickness of 20 nm; the anode 20 is a silver electrode with a thickness of 20 nm; the cathode 30 is an aluminium electrode with a thickness of 120 nm; the organic material functional layer 40 comprises an electron injection layer, an electron transport layer, a light emitting layer, a hole transport layer, and a hole injection layer.

The production process of the display panel specifically comprises the following steps of:

S101, placing the PET substrate into ethanol and a deionized water successively to be subjected to ultrasonic washing for 10 minutes respectively, and then placing it into an oven to be dried for about 20 minutes.

In which, the washing in ethanol may remove contaminations such as lipid and the like on the surface of the PET substrate.

S102, dissolving a tris(8-hydroxyquinolinato)aluminium derivative having a small molecular structure having a photo-crosslinkable group into toluene, and adding a micro amount of benzoyl peroxide (the doping concentration is 0.1%) to form a mixture, and spin coating the mixture on the surface of the washed PET substrate at a thickness of 20 nm.

S103, conducting ultraviolet (at a wavelength of 300 nm and with a power of 100 mW·cm$^{-2}$) irradiation in nitrogen atmosphere at room temperature for 100 seconds to subject the a tris(8-hydroxyquinolinato)aluminium derivative having a small molecular structure to a photo-crosslinking reaction to form a high molecular tris(8-hydroxyquinolinato)aluminium derivative, so as to form a reticular light output coupling layer 70.

S104, placing the substrate formed with the reticular light output coupling layer 70 into a vacuum chamber, and when the vacuum degree reaches $4 \times 10^{-4}$ Pa, plating a silver electrode on the surface of the reticular light output coupling layer 70 to form an anode 20 by a primary image forming process.

Herein, a silver electrode with a thickness of 20 nm may be formed on the surface of the reticular light output coupling layer 70.

S105, forming a hole injection layer (m-MTDATA, with a thickness of 25 nm), a hole transport layer (NPB, with a thickness of 10 nm), a light emitting layer (a mixture of CBP and FIrpic with a thickness of 25 nm, wherein the mass percent of Firpic is 10%), an electron transport layer ($Alq_3$, 25 nm), and an electron injection layer (LiF, with a thickness of 1 nm) on the substrate formed with the anode 20 successively so as to form an organic material functional layer 40.

S106, vacuum plating an aluminium electrode on the substrate formed with the organic material functional layer 40 to form a cathode 30 by a primary image forming process.

Herein, an aluminium electrode with a thickness of 120 nm may be formed on the surface of the electron injection layer.

A micro-cavity may be composed by forming the reticular light output coupling layer 70, the anode 20, the organic material functional layer 40, and the cathode 30 on the PET substrate, sequentially; wherein, in the direction vertical to the display panel, the thickness of the micro-cavity composed of the reticular light output coupling layer 70, the anode 20 and the cathode 30, and the organic material functional layer 40 is the cavity length of the micro-cavity.

As for the active matrix OLED display panel, the display panel further comprises a thin film transistor 80; in such case, the process further comprises: before the above step S104, a thin film transistor 80 may be further formed on the substrate formed with the reticular light output coupling layer 70 thereon.

Specifically, a gate electrode may be firstly formed on the reticular light output coupling layer 70 by a primary image forming process, then a gate insulting layer is formed; and then a semiconductor active layer is formed by the primary image forming process; and then a source electrode and a drain electrode are formed by the primary image forming process.

On the basis of the above, steps S104-S106 are then conducted on the substrate formed with the thin film transistor 80, to sequentially form the anode 20, the organic material functional layer 40, and the cathode 30, so as to form active matrix OLED display panel.

The invention provides a production process of the OLED display panel, wherein by forming a high molecular tris(8-hydroxyquinolinato)aluminium derivative having a reticular molecular structure as the light output coupling layer, the transmission enhanced film 50 and the buffer layer 60 in the prior art are combined, which may not only simplifies the structure of the display panel, but also improve the surface flatness of the flexible base substrate 10 and the water-oxygen permeation resistance of the display panel, and improve the light output ratio of the display panel. Furthermore, the spectrum narrowing and the wavelength shifting may be controlled by controlling the cavity length of the micro-cavity composed of the reticular light output coupling layer 70, the anode 20 and the cathode 30, and the organic material functional layer 40, so as to control the center wavelength of the electroluminescence spectrum and to improve the light output ratio.

The description above is only about the specific embodiments of the invention, but the protection scope of the invention is not limited herein. Any person skilled in the art may easily recognize changes or replacements within the technical range disclosed by the invention, which should be all involved in the protection scope of the invention. Therefore, the protection scope of the invention should be determined by the claims.

What is claimed is:

1. An OLED display panel, comprising an anode and a cathode provided on a flexible base substrate, and an organic material functional layer provided between the anode and the cathode; the display panel further comprises a reticular light output coupling layer provided on the flexible base substrate and contacting the flexible base substrate, wherein the reticular light output coupling layer has a flat surface;
   wherein the anode, the cathode and the organic material functional layer are all provided on the reticular light output coupling layer;
   the reticular light output coupling layer, the anode and the cathode, and the organic material functional layer compose an optical micro-cavity, wherein the optical micro-cavity is used for controlling the center wavelength of the electroluminescence spectrum and the light output ratio, and the optical micro-cavity means an optical micro resonant cavity wherein the size of the cavity in at least one direction is enough small to be comparative with the resonant light wave;
   the material of the reticular light output coupling layer is a reticular high molecular material; and
   the material of the reticular light output coupling layer comprises a high molecular tris(8-hydroxyquinolinato) aluminium derivative formed by the photo-crosslinking reaction of a small molecular tris(8-hydroxyquinolinato)aluminium derivative having a photo-crosslinkable group.

2. The display panel according to claim 1, wherein the thickness of the reticular light output coupling layer is not more than 100 nm.

3. The display panel according to claim 1, wherein,
   the anode is a transparent electrode or a metal electrode;
   the cathode is a metal electrode;
   wherein the anode is provided close to the reticular light output coupling layer, and in the case where the anode is a metal electrode, the thickness of the anode is between 20 and 40 nm.

4. The display panel according to claim 1, wherein the display panel further comprises a thin film transistor provided on the flexible base substrate;
   wherein the drain electrode of the thin film transistor is electrically connected to the anode.

5. The display panel according to claim 1, wherein the display panel further comprises a flexible encapsulating substrate or an encapsulating thin film.

6. A production process of an OLED display panel, comprising:
   forming a reticular light output coupling layer on a flexible base substrate, wherein the reticular light output coupling layer has a flat surface;
   on the substrate on which the reticular light output coupling layer is formed, forming an anode and a cathode, and an organic material functional layer between the anode and the cathode;
   wherein the reticular light output coupling layer, the anode and the cathode, and the organic material functional layer compose an optical micro-cavity, wherein the optical micro-cavity is used for controlling the center wavelength of the electroluminescence spectrum and the light output ratio, and wherein the optical micro-cavity means an optical micro resonant cavity wherein the size of the cavity in at least one direction is enough small to be comparative with the resonant light wave;

the material of the reticular light output coupling layer is a reticular high molecular material; and the material of the reticular light output coupling layer comprises a high molecular tris(8-hydroxyquinolinato) aluminium derivative formed by the photo-crosslinking reaction of a small molecular tris(8-hydroxyquinolinato)aluminium derivative having a photo-crosslinkable group.

7. The process according to claim 6, wherein the thickness of the reticular light output coupling layer is not more than 100 nm.

8. The process according to claim 6, wherein the process further comprises forming a thin film transistor on the flexible base substrate;

wherein the drain electrode of the thin film transistor is electrically connected to the anode.

9. The process according to claim 6, wherein the process further comprises forming a flexible encapsulating substrate or an encapsulating thin film.

* * * * *